(12) United States Patent
Blakely et al.

(10) Patent No.: US 6,618,266 B2
(45) Date of Patent: Sep. 9, 2003

(54) METHOD FOR HIGH-DENSITY, LOW-VIA-COUNT, DECOUPLING CAPACITOR PLACEMENT

(75) Inventors: Robert J. Blakely, Ft. Collins, CO (US); John S. Atkinson, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/800,282

(22) Filed: Mar. 6, 2001

(65) Prior Publication Data

US 2002/0172023 A1 Nov. 21, 2002

(51) Int. Cl.[7] .............................. H05K 1/18; H05K 1/03; H05K 1/16; H01G 4/228
(52) U.S. Cl. ................. 361/763; 361/306.1; 361/306.2; 174/255; 174/260
(58) Field of Search ................................ 174/250–268; 438/108, 393–396, 113, 114, 458–464; 257/691–694, 684–686, 734, 777–786, 678, 668, 712, 723–731, 700, 701; 361/271, 299.1, 299.2, 299.3, 298.4, 301.4, 306.1, 306.2, 306.3, 307, 308.1, 748, 760–764, 766–767, 784, 821

(56) References Cited

U.S. PATENT DOCUMENTS

| | | | | | |
|---|---|---|---|---|---|
| 5,719,750 | A | * | 2/1998 | Iwane | 361/794 |
| 5,898,576 | A | * | 4/1999 | Lockwood | 361/782 |
| 6,084,779 | A | * | 7/2000 | Fang | 361/763 |
| 6,215,649 | B1 | * | 4/2001 | Appelt | 361/312 |

* cited by examiner

*Primary Examiner*—David Martin
*Assistant Examiner*—Michael L. Lindinger

(57) ABSTRACT

A capacitor mounting method and resulting printed circuit board that increases the mounting density of both vias and decoupling capacitors is presented. Vias are shared between capacitors mounted on the top and bottom of the printed circuit board. This arrangement allows increased decoupling capacitor density and avoids the current doubling problem when shared vias are connected with capacitors installed on the same side of the board.

8 Claims, 3 Drawing Sheets

METHOD FOR HIGH-DENSITY, LOW-VIA-COUNT, DECOUPLING CAPACITOR PLACEMENT

FIELD OF THE INVENTION

The present invention pertains generally to capacitor placement in electronic circuits, and more particularly, to a via-sharing technique that increases the capacitor density and decreases the number of vias required for capacitor placement on a printed circuit board.

BACKGROUND OF THE INVENTION

Digital circuits consume high instantaneous currents while switching. These currents, while high in magnitude, are very short in duration, typically lasting only a small fraction of the switching event. The very fast low-to-high and/or high-to-low demand for current during switching can be problematic for many digital circuit designs.

All current consumed by digital devices is provided by the circuit power supply. However, due to the physical properties of inductance and time transfer, the high instantaneous currents needed by digital devices during switching cannot come directly from the power supply. Instead, the conventional solution is to place capacitors near the digital devices. These capacitors act as local reservoirs of charge, which can be released quickly in the form of current when the demand requires it. A common name for capacitors used in this manner is "decoupling capacitors".

However, these capacitors suffer from inductive properties as well. While their inductance is very much less than that of the power supply, the inductance is still problematic with very fast-switching digital circuits. The usual solution is to place many of these capacitors in a parallel grid structure across the power and ground connections of the digital devices. The overall inductive properties of capacitors combined in parallel tend to decrease while the capacitance itself increases.

Modern high-speed digital systems comprise one or more integrated circuit (IC) packages mounted on fiberglass boards called Printed Circuit Boards (PCBs). PCBs are formed of alternating laminated layers of fiberglass and metal, such as copper. Typically, each layer operates as either a power plane, a ground plane, or an interconnect layer providing routed metal lines between nodes in the circuit.

Prior art techniques mandate mounting decoupling capacitors on one of the outside PCB layers (i.e., the top or bottom layer) and connecting the positive and negative terminals of the capacitors to a respective power and ground plane within the PC board. The connections are made using vias. As known in the art, vias are formed by drilling holes in the PC and electroplating the walls of the hole with a conductor such as copper. A given layer in the PCB connects to a via if metal in that particular layer conductively connects to the conductive wall of the via. Accordingly, if no connection to the via is desired, the metal layer is etched around the location where the via will be formed to ensure that the layer does not make a conductive connection to the via. For example, a metal power layer will be etched around every negative via location, which connects to a ground plane, but will not be etched at positive via locations, which connect to power planes.

Large numbers of decoupling capacitors can be problematic. Their per-unit costs add up and can make products less cost-competitive in the marketplace. The physical space required for the capacitor grid on the PCB assemblies can make products larger, or displace ICs that can otherwise enhance a product's features. Additionally, as more capacitors are needed to decouple digital ICs, they must be placed further and further away from the ICs that they are meant to decouple. The further the distance of a decoupling capacitor from the IC, the less its effect, leading to diminishing returns.

Reliability for a product diminishes as the number of decoupling capacitors increases. Intuitively, this is due to the fact that the more devices in a circuit, the more opportunity for and likelihood that a device will fail. Accordingly, increasing the effectiveness of decoupling capacitors would allow for fewer numbers and more reliability for the product.

Each instance of a decoupling capacitor includes at least one pair of vias that connect it to the power and ground planes buried within the printed circuit board. As previously described, vias are metal lined holes that selectively make contact to the conductive layers on and within the board. The vias themselves take up additional PCB space. Multiple via pairs per decoupling capacitor decreases the mounting inductance at the cost of more board space.

Accordingly, a need exists for a method of placing capacitors at higher density and without the induction problems associated with prior via sharing.

SUMMARY OF THE INVENTION

In accordance with the invention, a technique which allows decoupling capacitors to share vias without increasing detrimental inductive properties is presented. The novel shared-via interconnect technique allows a denser capacitor and via mounting pattern.

In accordance with the invention, vias are shared between capacitors mounted on the top and bottom of the PCB. This arrangements avoids the current doubling problem of prior art via-sharing methods when shared vias are connected with capacitors installed on the same side of the PCB board. In an illustrative embodiment, each decoupling capacitor is connected to the PCB by four vias. Accordingly, the total via count per capacitor is approximately two for large numbers of capacitors connected in accordance with the invention. By sharing vias between capacitors mounted on both sides of the PCB, the invention allows for the benefits of four vias per capacitor, while only approximately two vias per capacitor are actually implemented.

Additional vias per decoupling capacitor may be implemented to decrease the mounting inductance and resistance and therefore increase the effectiveness of the decoupling capacitor. Overall, because each decoupling capacitor is more effective than prior art decoupling capacitors, fewer decoupling capacitors are required for a given application.

BRIEF DESCRIPTION OF THE DRAWINGS

The invention will be better understood from a reading of the following detailed description taken in conjunction with the drawing in which like reference designators are used to designate like elements, and in which.

DETAILED DESCRIPTION

Figure 1:
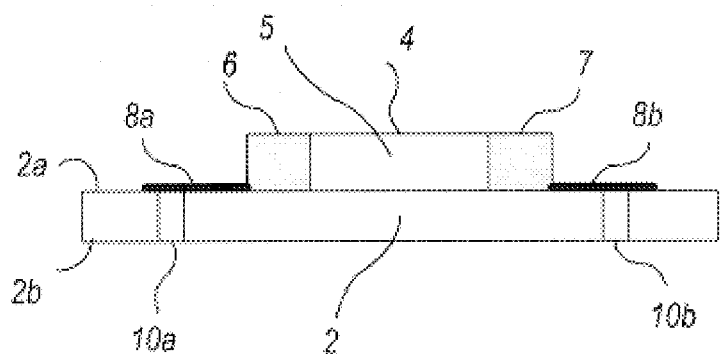
FIG. 1 is a side view of a capacitor conventionally mounted on a printed circuit board.

The invention will be more clearly understood by a brief exploration of the prior art. FIG. 1 is a side view of a capacitor 4 mounted in a conventional manner on a top layer 2a of printed circuit board (PCB) 2. As illustrated, the capacitor 4 is a two-lead device comprising a first conductor 6 separated from a second conductor 7 by a dielectric material 5. Each respective conductor 6 and 7 is electrically connected via solder to a respective copper pad (also referred to herein as a "trace") 8a and 8b. The trace is typically connected to one or more additional PCB layers (e.g., PCB layer 2b) by vias 10a, 10b. In the illustrative embodiment, trace 8a is electrically connected to via 10a and trace 8b is electrically connected to via 10b. The capacitor 4 makes electrical contact with the internal layers (for example second layer 2b) of the PCB 2 through traces 8a, 8b on the first PCB layer 2a and then through vias 10a and 10b.

Figure 2:
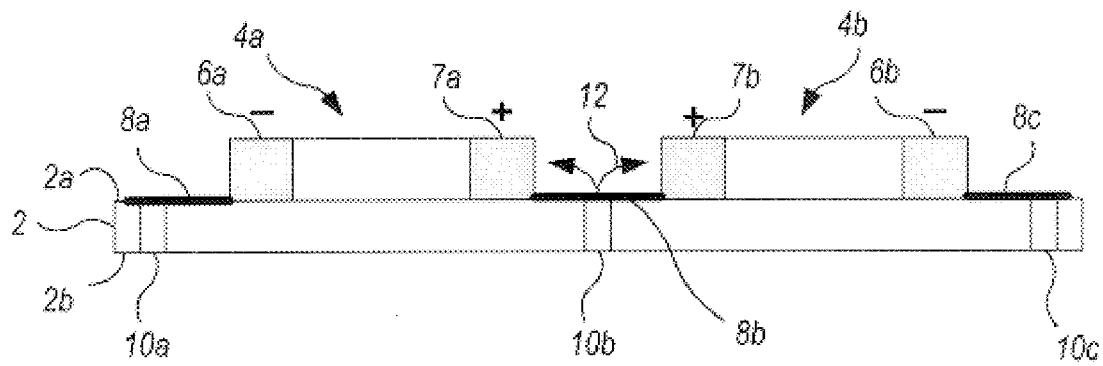
FIG. 2 is a side view of two capacitors conventionally mounted on a printed circuit board and sharing a via.

Decoupling capacitors must be installed together to meet the fast switching current demands of the high-speed digital circuits. Attempting to save space and cost by sharing vias between capacitors usually decreases each capacitor's effectiveness. For example, FIG. 2 shows two capacitors 4a and 4b mounted on printed circuit board 2 which each have a positive lead 7a, 7b that connects to trace 8b in order to share a via 10b. As illustrated, the shared via 10b between the two capacitors 4 "sees" current for each capacitor 4a and 4b. The currents for each capacitor 4a and 4b flow through the via 10b in the same direction, shown at arrows 12. This effectively doubles the current passing through the via 10b, causing twice the inductive loss, and therefore reducing the effectiveness of both of the capacitors 4a and 4b.

Figure 3:
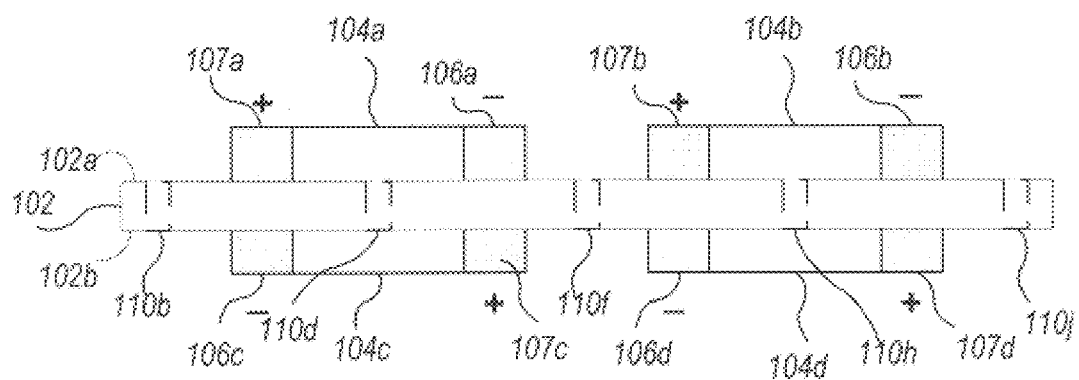
FIG. 3 is a side view of a portion of a printed circuit board implementing a capacitor decoupling circuit in accordance with the invention.

The present invention is a capacitor mounting pattern that allows sharing of vias yet is not subject to the inductive loss problems of the prior art. FIG. 3 is a side view of a portion of a printed circuit board 102 implementing a capacitor decoupling circuit in accordance with the invention. In the illustrative embodiment of FIG. 3, four capacitors 104a, 104b, 104c, and 104d are mounted on the PCB 102, two 104a, 104b on the top layer 102a and two 104c, 104d on the bottom layer 102b of the PCB 102. Vias are shared between the capacitors mounted on the top and bottom of the PCB 102. This mounting arrangement avoids the current doubling problem of prior art via-sharing methods, as discussed hereinafter, when shared vias are connected with capacitors installed on the same side of the PCB board.

Figure 4:
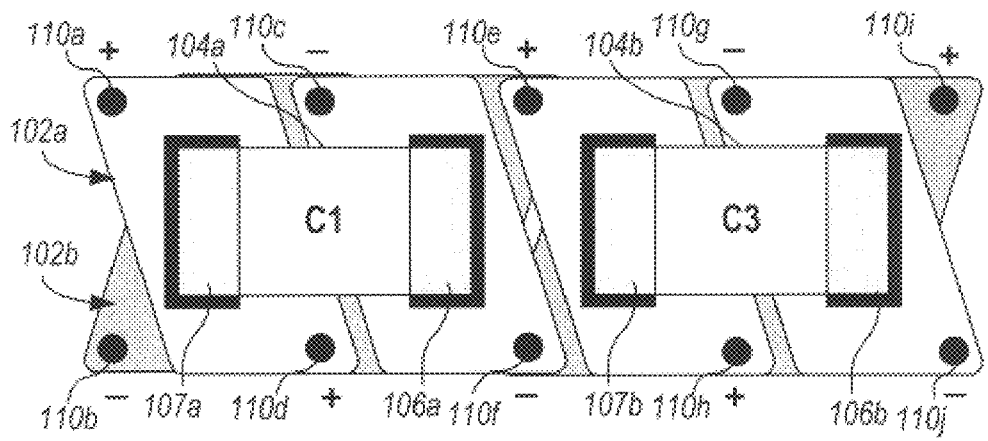
FIG. 4 is a top view of a printed circuit board having a capacitor decoupling circuit implemented in accordance with the invention.

FIG. 4 is a top view of the portion of the PCB board 102 illustrating only the top and bottom PCB board metal layers 102a and 102b, respectively. From this view, only the two capacitors 104a, 104b mounted on the top layer 102a of a PCB 102 are visible. The capacitors 104c and 104d are mounted on the bottom metal layer 102b directly opposite the visible capacitors 104a and 104b, as shown in FIG. 3. The bottom metal layer 102b is shown shaded below the top metal layer 102a. Vias 110a, 110d, 110e, 110h, and 110i each connect to one or more power planes (shown in FIG. 6) of the PCB 102. Vias 110b, 110c, 110f, 110g, and 110j each connect to one or more ground planes (also shown in FIG. 6) of the PCB 102. As illustrated, capacitor 104a has its positive terminal 107a connected to vias 110a and 110d and its negative terminal 106a connected to vias 110c and 110f. Capacitor 104b has its positive terminal 107b connected to vias 110e and 110h, and its negative terminal 106b to vias 110g and 110j.

Figure 5:
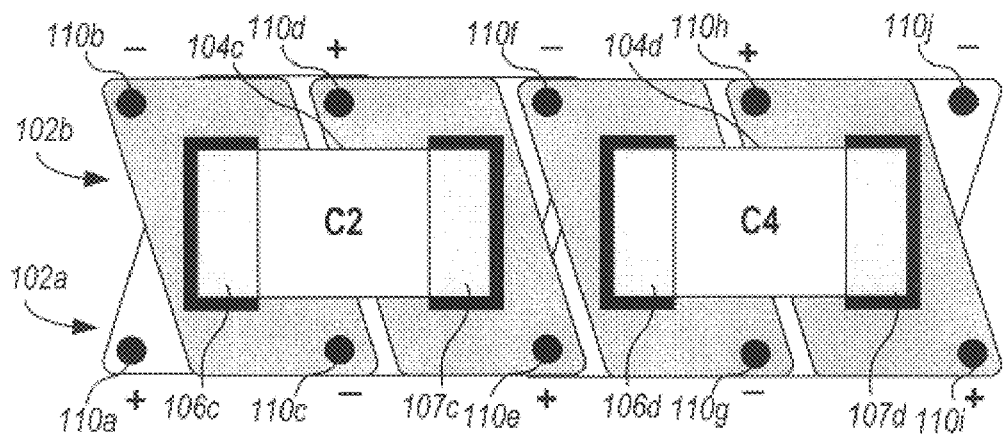
FIG. 5 is a bottom view of the same portion of the printed circuit board of FIGS. 3 and 4.

FIG. 5 is a bottom view of the same portion of the printed circuit board of FIGS. 3 and 4, again illustrating only the top and bottom PCB board metal layers 102a and 102b, respectively. The view shown is as if the PCB view of FIG. 4 were rotated 180° coming out of the page. The bottom metal layer 102b is shown shaded over the top metal layer 102a. From this view, only the two capacitors 104c, 104d mounted on the bottom layer 102b of PCB 102 are visible. The capacitors 104a and 104b are mounted on the top metal layer 102b directly opposite the visible capacitors 104c and 104d, as shown in FIG. 3. As illustrated, capacitor 104c has its negative terminal 106c connected to vias 110b and 110c and its positive terminal 107c connected to vias 110d and 110e. Capacitor 104d has its negative terminal 106d connected to vias 110f and 110g, and its positive terminal 107d to vias 110h and 110i.

From FIGS. 4 and 5, it will be understood that positive via 110d is shared by capacitors 104a and 104c; negative via 110c is shared by capacitors 104a and 104c; positive via 110e is shared by capacitors 104b and 104c; negative via 110f is shared by capacitors 104a and 104d; negative via 110g is shared by capacitors 104b and 104d; and positive via 110h is shared by capacitors 104b and 104d.

Figure 6:
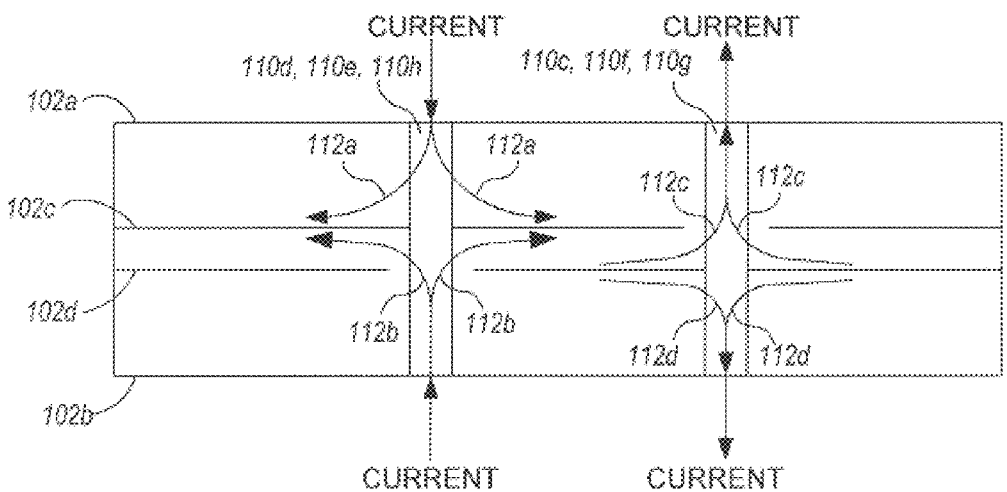
FIG. 6 is a side view of a printed circuit board illustrating the current flow of a shared via.

FIG. 6 is a side view of the PCB 102 with a single power plane 102c and a single ground plane 102d also shown, illustrating the current flow of a positive shared via 110d, 110e, or 110h and a negative shared via 110c, 110f, or 110g. A shared positive via 110d, 110e, 110h will connect with the positive inner copper power plane 102c of the PCB 102. At any given time, decoupling current (shown at arrows 112a and 112b) will flow through the via 110d, 110e either into or out of the power plane 102c, but never both in and out simultaneously. Accordingly, it is not possible for decoupling current to flow into the top of the via and out of the bottom, or vice versa. Additionally, the current through the via from the top mounted capacitor 104a, 104b flows directly into the power plane 102c, as does the current from the bottom capacitor 104c, 104d. No section of the via 110d, 110e, 110h has current from both capacitors 104a and 104c or 104b and 104d at the same time except at the boundary of the power plane 102c.

The inductive loss of the power plane 102c is very small compared with the via structure. Hence, any inductive contributions at the power plane 102c boundary are negligible and can effectively be ignored. Since no part of the via 110d, 110e has current flow from both top and bottom decoupling capacitors 104a and 104c or 104b and 104d at the same time, the inductive losses are never greater than that of an un-shared decoupling via.

The same applies to negative shared vias 110c, 110f, and 110g. As shown, a shared negative via 110c, 110f, 110g will connect with a ground plane 102d of the PCB 102. At any given time, decoupling current (shown at arrows 112c and 112d) will flow through the via 110c, 110f, 110g either into or out of the ground plane 102d, but never both in and out simultaneously. Accordingly, it is not possible for decoupling current to flow into the top of the via and out of the bottom, or vice versa. Additionally, the current through the via to the top mounted capacitor 104a, 104c flows directly out of the ground plane 102d, as does the current to the bottom capacitor 104c, 104d. No section of the via 110c, 110f, 110g has current from both capacitors 104a and 104c or 104b and 104d at the same time except at the boundary of the ground plane 102d.

It is known in the art that the parallel combination of equivalent inductors has half of the value of each inductor separately. From each capacitor terminal, it can be seen that this invention creates two identical via structures to the PCB power plane. This does not quite cut the total inductance of the capacitor decoupling circuit in half because the inductance associated with the capacitor itself is unaffected, but the interconnect inductance is reduced. This leads to less overall inductance of the capacitor decoupling circuit.

It will be appreciated that the invention can be extended to include three, four or even more connections to the power or ground plane(s) per capacitor terminal to realize further reduced interconnect inductance, and therefore even greater effectiveness of the capacitor.

A further benefit of having two or more vias per capacitor terminal is a reduction in capacitor decoupling circuit resistance. This benefit is realized in the same manner that the inductance is decreased. As resistance decreases, the decoupling effectiveness is increased.

Figure 7:
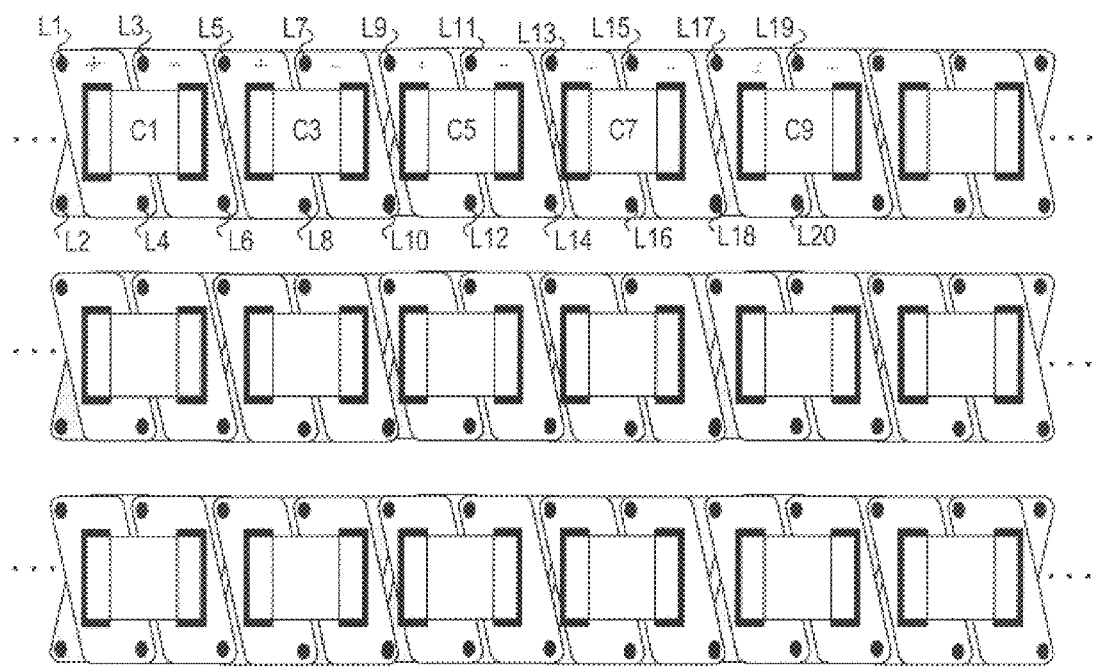
FIG. 7 is a top view of a decoupling capacitor grid mounted on a printed circuit board in accordance with the invention.

The mounting pattern illustrated in FIGS. 3–5 can be repeated indefinitely to reduce the average via-to-capacitor ratio. FIG. 7 is a top view of a decoupling capacitor grid mounted on a printed circuit board in accordance with the invention.

It will be appreciated from the description above that, for a four-via-connection pattern, the average number of vias per capacitor has a maximum of three, and quickly falls to nearly two as the pattern is repeated. This is shown in TABLE 1.

TABLE 1

| Number of back-to-back capacitors in grid (n) | Total number of vias (2n + 2) | Average number of vias (2n + 2)/n |
|---|---|---|
| 2 | 6 | 3.00 |
| 4 | 10 | 2.50 |
| 6 | 14 | 2.33 |
| 8 | 18 | 2.25 |
| 10 | 22 | 2.20 |
| 12 | 26 | 2.17 |
| . | . | . |
| . | . | . |
| . | . | . |
| 30 | 62 | 2.07 |

It will be seen from the foregoing table that the number of vias provided according to the present invention can be expressed by the mathematical expression 2n+2, where n is the number of back-to-back capacitors mounted to the printed circuit board.

The connection pattern for an extended number of capacitors is shown in FIG. 7, where five odd numbered capacitors $C_1$ through $C_9$ mounted to one metal layer are identified, along with twenty vias, $L_1$ through $L_{20}$. From the pattern of FIGS. 3, 4, and 5, it will be understood that five even numbered capacitors $C_2$ through $C_{10}$ are mounted to the other metal layer on the opposite side of the printed circuit board.

From FIG. 7, it will be seen that a first terminal of capacitor $C_1$ is electrically connected to vias $L_1$ and $L_4$ and the second terminal of capacitor $C_1$ is connected to vias $L_3$ and $L_6$. On the opposite side of the printed circuit board, the first terminal of capacitor $C_2$ is connected to vias $L_2$ and $L_3$ and the second terminal of capacitor $C_2$ is connected to vias $L_4$ and $L_5$.

Extending this pattern, the capacitor terminal connections to the vias may be generalized as follows. The first terminal of each odd numbered capacitor, i, (where i is a number from 1 to n-1) is electrically connected to vias numbered 2i−1 and 2i+2. The second terminal of each odd numbered capacitor, i, is connected to vias numbered 2i+1 and 2i+4. Similarly, the first terminal of each even numbered capacitor, i, (where i is a number from 2 to n) is electrically connected to vias numbered 2i−2 and 2i−1, and the second terminal of each even numbered capacitor, i, is connected to vias 2i and 2i+1.

As illustrated, the capacitors are mounted on a PCB according to a pattern that increases the mounting density of both vias and decoupling capacitors. This pattern also increases the effective number of vias from two to four per capacitor, while averaging closer to two vias per capacitor for large patterns. Both sides of the PCB board are utilized, further decreasing the space required for the decoupling capacitors.

Although the invention has been described in terms of the illustrative embodiments, it will be appreciated by those skilled in the art that various changes and modifications may be made to the illustrative embodiments without departing from the spirit or scope of the invention. For example, the polarities of the decoupling capacitors may be reversed or the metal power layer voltage may be made negative with respect to the metal ground layer. It is intended that the scope of the invention not be limited in any way to the illustrative embodiment shown and described but that the invention be defined only by the claims appended hereto.

What is claimed is:

1. A printed circuit board, comprising:

a first metal layer;

a second metal layer;

a metal power layer;

a metal ground layer;

four decoupling capacitors, C1, C2, C3 and C4, mounted to said printed circuit board, decoupling capacitors C1 and C3 mounted on said first metal layer and decoupling capacitors C2 and C4 mounted on said second metal layer;

a via 1 electrically connecting said first metal layer to said metal power layer;

a via 2 electrically connecting said second metal layer to said metal ground layer;

a plurality of vias 4, 5 and 8 electrically connecting said first metal layer and said second metal layer to said metal power layer;

a plurality of vias 3, 6, and 7 electrically connecting said first metal layer and said second metal layer to said metal ground layer;

a via 9 electrically connecting said second metal layer to said metal power layer;

a via 10 electrically connecting said first metal layer to said metal ground layer;

decoupling capacitor C1 having a first terminal electrically connected to via 1 and via 4 and a second terminal electrically connected to via 3 and via 6;

decoupling capacitor C2, having a first terminal electrically connected to via 4 and via 5 and a second terminal electrically connected to via 2 and via 3;

decoupling capacitor C3 having a first terminal electrically connected to via 5 and via 8 and a second terminal electrically connected to via 7 and via 10; and decoupling capacitor C4 having a first terminal electrically connected to via 8 and via 9 and a second terminal electrically connected to via 6 and via 7.

2. A printed circuit board, comprising:

a first metal layer;

a second metal layer;

a metal power layer;

a metal ground layer;

a plurality of decoupling capacitors, represented by an integer, n (wherein n>1), wherein each decoupling capacitor is individually numbered by a second integer, i (wherein i=1, 2, 3, . . . , n), mounted to said printed circuit board, odd numbered decoupling capacitors being mounted on said first metal layer and even numbered decoupling capacitors being mounted on said second metal layer;

a plurality (2n+2)/2 of positive vias electrically connecting said first metal layer and said second metal layer to said metal power layer;

a plurality (2n+2)/2 of negative vias electrically connecting said first metal layer and said second metal layer to said metal ground layer;

odd numbered decoupling capacitors having their first terminals electrically connected to positive vias 2i−1 and 2i+2 and their second terminals electrically connected to negative vias 2i+1 and 2i+4;

even numbered decoupling capacitors having their first terminals electrically connected to positive vias 2i and 2i+1 and their second terminals electrically connected to negative vias 2i−2 and 2i−1.

3. A method for placing decoupling capacitors on a printed circuit board, said printed circuit board comprising a first metal layer, a second metal layer, a metal power layer, and a metal ground layer, said method comprising the steps of:

providing a plurality of positive vias for electrically connecting said first metal layer and said second metal layer to said metal power layer;

providing a plurality of negative vias for electrically connecting said first metal layer and said second metal layer to said metal ground layer;

placing a plurality of capacitors represented by an integer, n (wherein n>1), on said printed circuit board such that at least (2n−2)/2 positive vias and (2n−2)/2 negative vias are shared among said n capacitors.

4. The method according to claim 3 wherein no more than 2n+2 vias are required for electrically connecting the first and second terminals of said n capacitors.

5. The method according to claim 3 wherein approximately one-half of said n capacitors are placed on each of said first and second metal layers.

6. The method according to claim 3 further comprising:

electrically connecting a first terminal of a first capacitor to a first positive via (L1) and a second positive via (L4) and electrically connecting a second terminal of said first capacitor to a first negative via (L3) and a second negative via (L6);

electrically connecting a first terminal of a second capacitor to a third positive via (L5) and said second positive via (L4) and electrically connecting a second terminal of said second capacitor to said first negative via (L3) and a third negative via (L2);

electrically connecting a first terminal of a third capacitor to said third positive via (L5) and a fourth positive via (L8) and electrically connecting a second terminal of said third capacitor to a fourth negative via (L7) and a fifth negative via (L10);

electrically connecting a first terminal of a fourth capacitor to said fourth positive via (L8) and a fifth positive via (L9) and electrically connecting a second terminal of said fourth capacitor to said second negative via (L6) and said fourth negative via (L7).

7. A method for placing a plurality of decoupling capacitors, represented by an integer, n (wherein n>1), wherein each decoupling capacitor is individually numbered by a second integer, (wherein i=1, 2, 3, . . . , n), on a printed circuit board, said printed circuit board comprising a first metal layer, a second metal layer, a metal power layer and a metal ground layer, said method comprising the steps of:

providing a plurality of vias for electrically connecting said first metal layer and said second metal layer to said power layer;

providing a plurality of vias for electrically connecting said first metal layer and said second metal layer to said ground layer;

placing said n decoupling capacitors on said printed circuit board to share vias, whereby:

the first terminals of decoupling capacitors, i, having odd numbers (i=1, 3, 5, . . . , n−1) are electrically connected to vias numbered 2i−1 and 2i+2, the second terminals thereof are electrically connected to vias numbered 2i+1 and 2i+4, the first terminals of decoupling capacitors, i, having even numbers (i=2, 4, 6, . . . , n) are electrically connected to vias numbered 2i and 2i+1, and the second terminals thereof are electrically connected to vias numbered 2i−2 and 2i−1.

8. The method of claim 7 wherein the first terminals of said decoupling capacitors are positive polarity and the second terminals of said decupling capacitors are negative polarity.

* * * * *